United States Patent [19]

DiLazzaro et al.

[11] Patent Number: 5,068,210
[45] Date of Patent: Nov. 26, 1991

[54] LOW DIELECTRIC CONSTANT CERAMIC MATERIALS

[75] Inventors: John F. DiLazzaro, Lake Oswego, Oreg.; James L. McAlpin, Somers Point, N.J.; Joanne R. Mark, Aloha, Oreg.

[73] Assignee: Tektronix, Inc., Beaverton, Oreg.

[21] Appl. No.: 195,569

[22] Filed: May 17, 1988

Related U.S. Application Data

[63] Continuation-in-part of Ser. No. 853,515, Apr. 18, 1986, abandoned.

[51] Int. Cl.$^5$ .................. C03C 14/00; C03C 3/108
[52] U.S. Cl. ........................... 501/32; 501/17; 501/61
[58] Field of Search .................. 501/17, 32, 61, 62

[56] References Cited

U.S. PATENT DOCUMENTS

| | | | |
|---|---|---|---|
| 3,258,352 | 6/1966 | Paymal | 501/61 X |
| 3,503,763 | 3/1970 | Mills | 501/61 |
| 3,970,465 | 7/1976 | Houben | 501/61 |
| 4,520,115 | 5/1985 | Speit et al. | 501/61 X |
| 4,624,934 | 11/1986 | Kokubu et al. | 501/17 |
| 4,654,095 | 3/1987 | Steinberg | 501/17 X |
| 4,655,864 | 4/1987 | Rellick | 501/17 X |
| 4,755,490 | 7/1988 | DiLazzaro | 501/17 |

FOREIGN PATENT DOCUMENTS 0004988 3/1966 Japan ...................... 501/61

*Primary Examiner*—Karl Group
*Attorney, Agent, or Firm*—Richard J. Polley; John D. Winkelman

[57] ABSTRACT

A dense, sintered ceramic material having a low dielectric constant, a low firing temperature, and a low coefficient of thermal expansion is provided from a mixture of 0–30 wt. % alumina, 30–60 wt. % fused silica, and 30–70 wt. % of a glass comprised of PbO, $B_2O_3$, and $SiO_2$. The mixture has a minimum sintering temperature in the range of 800°–900° C., and can be formed by conventional manufacturing techniques. It is particularly useful for the fabrication of single or multilayer electronic circuit substrates.

6 Claims, No Drawings

LOW DIELECTRIC CONSTANT CERAMIC MATERIALS

This is a continuation-in-part of patent application Ser. No. 853,515, filed Apr. 18, 1986 now abandoned.

TECHNICAL FIELD

The present invention relates to the field of ceramics, and in particular to glass and ceramic materials sintered at low temperatures to produce dense, nonporous bodies having low coefficients of thermal expansion and low dielectric constants.

BACKGROUND OF THE INVENTION

In the field of electronics, ceramics are used in a variety of applications, including hybrid circuit substrates, passive components, semiconductor packages, and multilayer substrates. Multilayer substrates are formed by laminating a plurality of thin ceramic layers together. Conductive patterns are formed on some or all of the layers prior to lamination, and are selectively connected together in the laminated structure through openings, or "vias", in the individual layers. The ceramic compositions used in such applications generally require very high temperatures (e.g., 1600° C.) for sintering. As a result, the conductive patterns in multilayer ceramic circuits must be formed of refractory metals, such as tungsten, molybdenum or molybdenum/manganese ("molymanganese"), since metals conventionally used for electronic circuits—copper, gold, silver, and aluminum—would melt during the sintering operation.

The industry has sought in recent years to develop a glass-ceramic material that can be sintered at lower temperatures. Among other advantages, this would permit low resistance, nonrefractory metals, such as gold, silver, and copper, to be used for circuit conductors. The efforts to develop lower firing temperature ceramics have also been directed at obtaining compositions that may be fired in non-oxidizing atmospheres, such as nitrogen, forming gas, or hydrogen, as well as in air, to permit copper to be used as a conductor material. Conventional air firing would oxidize circuitry formed of copper.

Low firing temperature multilayer glass-ceramic substrates have been manufactured from compositions containing alumina and lead borosilicate. Such materials are described in U.S. Pat. No. 3,457,091, and in Shinada et al., "Low Firing Temperature Multilayer Glass-Ceramic Substrate", IEEE (1983). But, heretofore such materials have always had a significantly high dielectric constant of more than seven.

Multilayer ceramic substrates also have been produced from a mixture of $Al_2SiO_2$, $ZrO_2$, and $MgO$ sintered at 800° to 1,000° C. in air. The coefficient of thermal expansion of the resulting ceramic is somewhat higher than desired, thus reducing the structural stability of the substrate.

SUMMARY OF THE INVENTION

The present invention is broadly directed to providing improved, low firing temperature glass-ceramic compositions having a very low dielectric constant of 6.0 or less, and to methods for making sintered ceramic materials using such compositions. Preferred compositions include, according to the invention, 0-30 wt. % alumina, 30-60 wt. % fused silica and 30-70 wt. % of a glass composed of about 25 wt. % PbO, 35 wt. % $B_2O_3$, and 40 wt. % $SiO_2$ in ratio such that the mixture has a minimum sintering temperature not greater than 1000° C. The mixture is sintered, preferably, at a temperature of 800°-900° C. The sintering operation may be carried out in oxidizing, neutral, or reducing atmospheres. In certain embodiments of the invention, the mixture of silica and glass further includes up to 30 wt. % of alumina to adjust the dielectric constant. Small amounts of other oxides may also be present, but are not required.

DETAILED DESCRIPTION OF PREFERRED EMBODIMENTS

The preferred glass-ceramic compositions of the invention comprise a mixture of three principal components: alumina ($Al_2O_3$), a lead borosilicate glass, and fused silica ($SiO_2$). The percentages of each component may be varied within the ranges delineated below, depending on the final desired properties of the fired ceramic material. Dense, nonporous, ceramic materials can be formed from such compositions by normal manufacturing techniques and low temperature (i.e., 800°-1000° C.) sintering.

In a preferred application of the invention, such a mixture is formed into a thin tape, via holes are punched through the tape at desired locations, and one or more metal conductor paths are formed on the punched tape. Suitable metals for the conductor paths include copper, silver, gold, platinum/gold, and palladium/silver. The tape is subsequently sintered at low temperature, typically after two or more sections have been laminated together to form a multilayer circuit substrate.

Low firing temperature glass-ceramic compositions of the invention are produced by providing a mixture of powdered ingredients, including 30-60 wt. % $SiO_2$, and 30-70 wt. % of a lead borosilicate glass composed of about 25 wt. % PbO, 35 wt. % $B_2O_3$, and 40 wt. % $SiO_2$ in amounts such that the mixture has a minimum sintering temperature not greater than 1000° C. A quantity of the mixture is then formed into a desired shape using conventional procedures, and sintered at a tmperature of at least 800° C., preferably 800°-900° C. The sintering may be conducted in an oxidizing, neutral, or reducing atmosphere. In some applications, the mixture may contain up to 30 wt. % alumina. If the mixture contains more than about 30 wt. % fused alumina, the dielectric constant will be substantially increased. To keep the dissipation factor of the sintered ceramic body low, the mixture should contain a minimal quantity of alkali metal, preferably substantially none.

The resulting sintered ceramic material comprises about 0-25 wt. % $Al_2O_3$, 46-76 wt. % $SiO_2$, 10-25 wt. % $B_2O_3$, and 7-18 wt. % PbO. Other oxides may be present in small quantities as impurities.

A superior composition is made using a glass composed of 25 wt. % PbO, 35 wt. % $B_2O_3$, and 40 wt. % $SiO_2$. The amount of glass used affects the sintering temperature. If too little glass is used (for example, less than about 30 wt. % in this embodiment), the sintering temperature will be too high to achieve the benefits of the present invention. Maintaining the proportion of glass within the range of 30-70 wt. % is necessary to obtain these benefits.

The following example illustrates a glass-ceramic composition of the invention.

EXAMPLE

Starting materials consisted essentially of 60 wt. % fused silica and 40 wt. % glass. A mixture of these materials was ground in a ball mill for 20 hours to achieve a particle size of 1-2 microns. The material was then spray dried and formed into 2-in. (5 cm) diameter, ¼ inc. (0.6 cm) discs by compressing the milled mixture in a mold at 15,000 psi (1060 kg/cm$^2$). The discs were then fired in air for 1-2 hours at 900° C. The resulting sintered ceramic material had the following properties: fired density 2.32 g/cc; dielectric constant 4.10 at 1 MHz, coefficient of expansion $2.5 \times 10^6$ in/in/° C. from 25° C.-500° C.

To form dielectric layers for multilayer high frequency circuit packages, the starting materials are ground in a ball mill until they have an average particle size of 1-2 microns. A slurry is then formed by combining the finely ground powder with a suitable solvent and other conventional additives, such as a plasticizer and a binder, in a manner known in the art. The slurry is cast into thin "green" (unfired) sheets having a thickness of about 75 to 400 microns using a conventional doctor blading process, after which the green sheets are blanked into individual 125 mm square sheets or tapes. Via holes next are formed in the green sheets by a die punching process. The holes suitable may have a diameter of about 125 microns. A conductor paste is applied in a desired pattern to the punched sheets using a screen printing process. The paste is also applied within the via holes to form connections between conductor patterns. The principal metallic constituent of the paste may be gold, silver, copper, silver/palladium alloy, gold/platinum alloy, or other suitable materials. The printed green sheets are then stacked in a desired sequence using alignment holes to insure correct positioning, and laminated together at 50°-100° C. under a pressure between about 35 and 250 kg/cm$^2$. Finally, the laminated green sheets are fired at a temperature not exceeding 1000° C. to form dense, sintered ceramic multilayer circuit substrates. The firing may be done in air if the conductor metal is not susceptible to oxidation at the firing temperature. Such is thie case, for example, with the metals named above, except for copper, which requires a reducing or neutral atmosphere. Sheets formed in the manner described usually have a greater density than the discs formed by the procedure of the previous example.

The compositions of the present invention also can be used for form rigid, nonporous ceramic bodies by substantially conventional techniques. The batch ingredients are combined with water and organic binders, and ball milled for a period of about 20 hours. The resulting slurry is spray dried to provide a powder of substantially spherical particles. This powder can be used to form bodies of various desired shaped by standard forming techniques, such as dry or isostatic pressing. The bodies are then fired at a suitable temperature not exceeding 1000° C. to provide dense, sintered ceramic objects.

It will be apparent to those skilled in the relevant art that various changes and modifications may be made in the embodiments deacribed above to achieve the same or equivalent results without departing from the principles of the present invention as described and claimed herein. All such changes and modifications are intended to be covered by the following claims.

We claim:

1. A method of forming a dense, nonporous ceramic object having a low dielectric constant, comprising the steps of
   providing a compressed mixture of finely-divided solids consisting essentially of
   a) 30-60 wt % fused silica, and
   b) 40-70 wt % lead borosilicate glass composed of about 25 wt % PbO, about 35 wt % $B_2O_3$, and about 40 wt % $SiO_2$,
   the proportions of components a) and b) being chosen to provide a mixture having a sintering temperature not greater than 1000° C., and
   sintering the compressed mixture at a temperature not greater than 1000° C.

2. The method of claim 1, wherein the mixture consists essentially of 60 wt % fused silica and 40 wt % lead borosilicate glass.

3. The method of claim 1, wherein the mixture is sintered in an oxidizing atmosphere at a temperature in the range of 800°-900° C.

4. A method of forming a dense, nonporous ceramic object having a low dielectric constant, comprising the steps of
   providing a compressed mixture of finely-divided solids consisting essentially of
   a) 0-30 wt % alumina
   b) 30-60 wt % fused silica
   c) 30-70 wt % lead borosilicate glass composed of about 25 wt % PbO, about 35 wt % $B_2O_3$, and about 40 wt % $SiO_2$,
   the proportions of components a), b) and c) being chosen to provide a mixture having a sintering temperature not greater than 1000° C., and
   sintering the compressed mixture at a temperature not greater than 1000° C.

5. The method of claim 4, wherein the mixture consists essentially of 60 wt % fused silica and 40 wt % lead borosilicate glass.

6. The method of claim 5, wherein the mixture is sintered at a temperature in the range of 800°-900° C.

* * * * *